United States Patent [19]
Kliman

[11] Patent Number: 5,030,917
[45] Date of Patent: Jul. 9, 1991

[54] TRANSIENT ROTOR FAULT DETECTION IN INDUCTION AND SYNCHRONOUS MOTORS

[75] Inventor: Gerald B. Kliman, Schenectady, N.Y.

[73] Assignee: General Electric Company, Schenectady, N.Y.

[21] Appl. No.: 512,247

[22] Filed: Apr. 20, 1990

[51] Int. Cl.$^5$ ............................................ G01R 31/06
[52] U.S. Cl. .............................. 324/545; 324/158 MG
[58] Field of Search ............. 324/545, 158 MG, 73.1; 361/23, 31

[56] References Cited

U.S. PATENT DOCUMENTS

| | | | |
|---|---|---|---|
| 2,640,100 | 5/1953 | Parker et al. | 324/545 |
| 2,939,074 | 5/1960 | Perrett | 324/545 |
| 4,377,784 | 3/1983 | Saito | 324/545 |
| 4,509,088 | 4/1985 | Profio | 361/31 |
| 4,761,703 | 8/1988 | Kliman et al. | 324/545 |
| 4,808,932 | 2/1989 | Schulz et al. | 324/158 MG |
| 4,914,386 | 4/1990 | Zocholl | 324/158 MG |
| 4,922,172 | 5/1990 | Roddy et al. | 324/158 MG |
| 4,940,932 | 7/1990 | Herrick et al. | 324/545 |

FOREIGN PATENT DOCUMENTS 800906 2/1981 U.S.S.R. .............................. 324/545

OTHER PUBLICATIONS

Vas, P., "Steady State and Transient Performance of Induction Moters with Rotor Asymmetry", IEEE Trans. PAS, vol. PAS-101, No. 9, 9/82.
Smith, A. E., "Harmonic Field Analysis for Slip-Ring Motors Including General Rotor Asymmetry", IEEE/IAS Annual Meeting, 12/1989.
Lutidize et al., Electrichestvo, No. 5, pp. 64-67, 12/1980, "Study of Electromechanical Transients in Submersible Motor with Rotor Asymmetry".
Kryter, R. C., et al., Power Engineering, 10/1988, "How to Monitor Motor-Driven Machinery by Analyzing Motor Current".
Diagnosing Alternating Current Electric Motor Problems, W. R. Campbell, Vibrations, vol. 1, No. 3, 12/85, pp. 12-15.

*Primary Examiner*—Kenneth A. Wieder
*Assistant Examiner*—Maura K. Regan
*Attorney, Agent, or Firm*—Henry J. Policinski; Robert A. Cahill

[57] ABSTRACT

To detect broken bars in the rotor of induction and synchronous motors, the current drawn by the motor during the transient startup period as the motor runs up to steady state speed is analyzed to identify any dip in the starting motor current amplitude occurring when the motor reaches approximately half-speed. The magnitude of any identified current dip is tested against threshold values to determine if the dip is characteristic of a broken rotor bar condition. Reliable broken rotor bar detection is achieved regardless of whether the motor is loaded or unloaded.

12 Claims, 5 Drawing Sheets

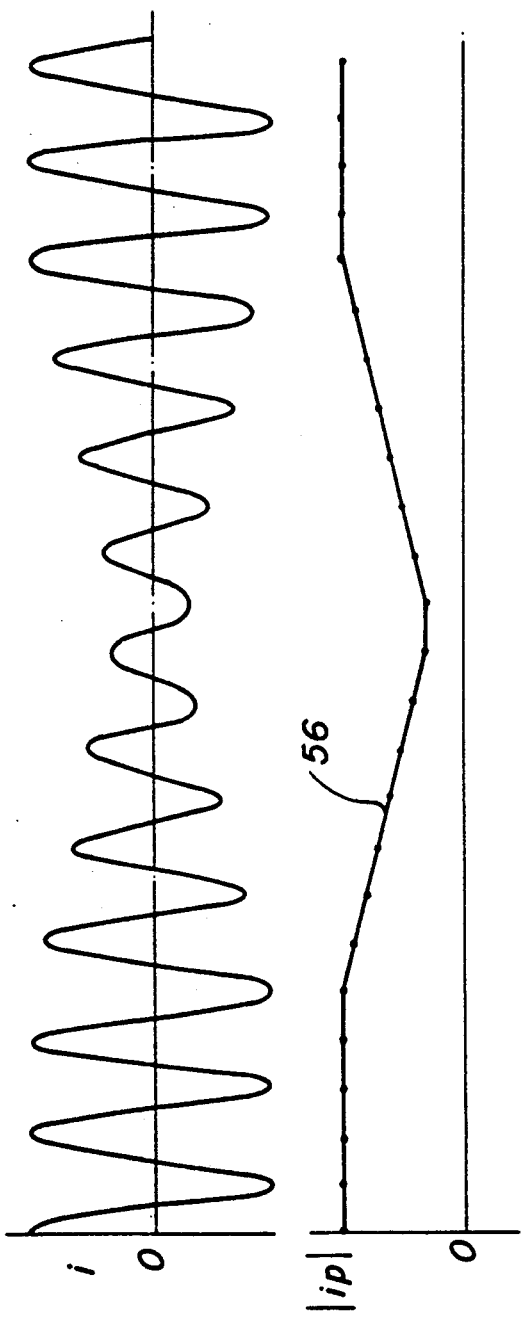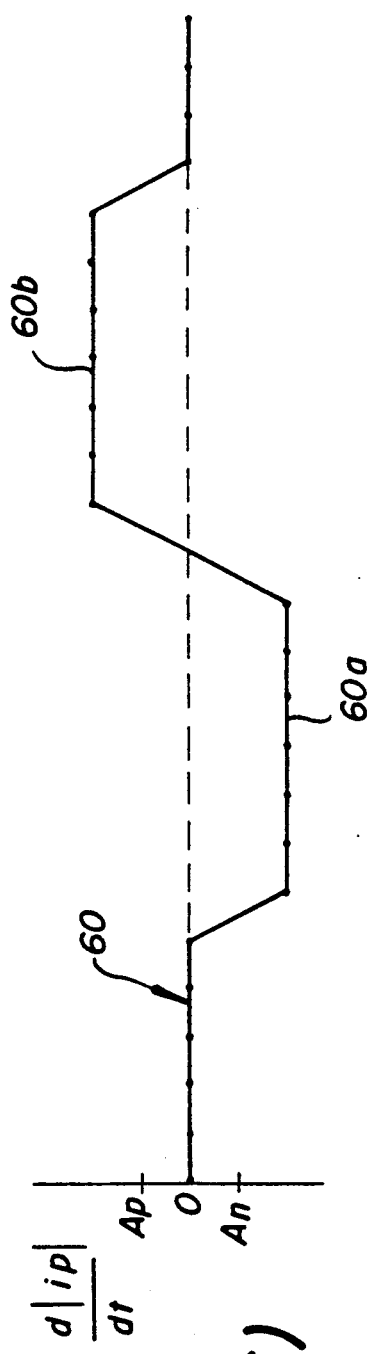
FIG.3(d)
FIG.3(e)
FIG.3(f)

TRANSIENT ROTOR FAULT DETECTION IN INDUCTION AND SYNCHRONOUS MOTORS

The present invention relates to the inspection of electrical motors and particularly to the detection of rotor faults in induction and synchronous motors.

BACKGROUND OF THE INVENTION

Both utility and industrial users of induction motors and synchronous motors equipped with starting/stabilization (amortisseur) cages have historically been concerned in finding reliable procedures for detecting rotor faults or "cage faults" before such faults exacerbate to the point of catastrophic motor failure. Obviously, such motor failures can force expensive shutdowns of factory production and in certain applications can have adverse safety implications.

Until recently, the detection of rotor faults in induction motors involved taking the motor out of service, disassembly and/or the application of special instrumentation internally and/or externally of the motor. For example, U.S. Pat. No. 4,808,932 discloses a broken rotor bar detector which requires the installation of a flux coil wound on one of the stator teeth of an induction motor. Implementation of such a detector requires motor disassembly, unless the flux coil is installed at the time of manufacture or rewinding. U.S. Pat. No. 4,761,703 discloses a rotor fault detector based on motor current analysis, but requires the stationing of a flux coil at an appropriate external position proximate the induction motor to pick up stray axial flux in order to precisely determine motor speed. This approach does not require motor disassembly, or, in many cases, an interruption in service. However, in some motor applications it is not convenient from the standpoint of accessibility or there is no space available to station the flux coil in an appropriate external flux detection position. In applicants' copending application entitled "Spectral Analysis of Induction Motor Current to Detect Rotor Faults with Reduced False Alarms" Ser. No. 07/512,223 filed Apr. 20, 1990, rotor faults, such as broken bars, are detected exclusively by analysis of the motor current frequency spectrum.

To reliably detect rotor faults in accordance with the above-cited U.S. Pat. No. 4,761,703 and copending application, the induction motor being tested must be under steady state operating conditions, i.e., constant motor current and uniform loading. Unfortunately, in certain motor applications, steady state operating conditions do not exist or exist for such a short time period that reliable rotor fault detection by motor current spectral analysis is not possible. Specifically, the character of the motor service may be such that the motor operating cycle may be so short and/or the motor load so varied that a steady state operating condition is never achieved. An example of such service is induction motor driven valves widely utilized in utility power plants, wherein the complete operating cycle from start to stop may be only several seconds for the smaller valves and ten to fifteen seconds for the larger valves.

There are many occasions when it would be advantageous to rotor fault test an induction motor under no load conditions. For example, service shops would prefer to test an induction motor for cracked or broken rotor bars simply by energizing it and analyzing the motor current and/or axial flux without having to mechanically connect the motor to some sort of load or dynamometer. Unfortunately, reliable rotor fault detection pursuant to U.S. Pat. No. 4,761,703 and applicant's cited copending application requires the induction motor to be uniformly loaded during the data collection period.

Heretofore, there has been no reliable procedure for non-invasively testing the amortisseur of synchronous motors for broken bars. This is due to the fact that amortisseur bars carry appreciable current only during startup and little or no current under steady state operating conditions. Consequently, the perturbations of motor current and axial flux caused by cracked or broken amortisseur bars are too small under steady state operating conditions to provide a basis for rotor fault detection.

It is accordingly an object of the present invention to provide an improved method and apparatus for practicing same to detect rotor faults in electric motors.

A further object is to provide a method and apparatus of the above-character for detecting rotor faults in electric motors under transient operating conditions.

Another object is to provide a method and apparatus of the above-character for detecting rotor faults in electric motors under no load conditions.

An additional object is to provide a rotor fault detection method and apparatus of the above-character, which rely solely on analysis of motor current and thus are totally non-invasive of the motor operating environment.

Yet another object is to provide a rotor fault detection method and apparatus of the above-character, which are capable of detecting broken or cracked rotor bars in synchronous as well as induction motors.

Other objects of the invention will in part be obvious and in part appear hereinafter.

SUMMARY OF THE INVENTION

In accordance with the present invention, there is provided a method and apparatus for the practice thereof by which both induction and synchronous motors are tested for rotor faults under transient operating conditions, specifically during startup. When an induction motor is first energized and begins its runup to normal operating speed under either load or no load conditions, the current drawn by the motor initially jumps to a high amplitude and then decreases to a steady state amplitude as the motor comes up to normal operating speed. If the motor's rotor is free of fault, the motor current amplitude monotonically decreases from an initial high amplitude to an ultimate steady state amplitude. However, it has been observed that, in the case of a rotor having one or more broken rotor bars, the motor current undergoes an abnormal dip in amplitude during this startup period. That is, the startup current envelope decreases in amplitude more rapidly than is characteristic of a normal startup current envelope and then increases back to normal. This rotor fault-indicating current dip characteristically occurs when the motor reaches about one-half of its synchronous or normal operating speed. Moreover, the magnitude of the current dip should provide an indication of the severity of the rotor fault, e.g., number of broken rotor bars.

The present invention, in recognition of this characteristic rotor fault-indicating current dip, provides a method and apparatus for collecting and processing motor current data during startup pursuant to positively identify the presence of this motor current dip in the startup current envelope and thereupon to indicate the rotor fault condition of the motor under test. The invention is equally applicable to detecting broken amortisseur bars in synchronous motors.

The invention accordingly comprises the features of construction, arrangements of parts and combinations of elements, as well as a combination of method steps, all of which as detailed below, and the scope of the invention will be indicated in the claims.

BRIEF DESCRIPTION OF THE DRAWINGS

For a full understanding of the nature and objects of the invention, reference may be had to the following Detailed Description taken in conjunction with the accompanying drawings, in which.

DETAILED DESCRIPTION OF THE INVENTION

Figure 1:
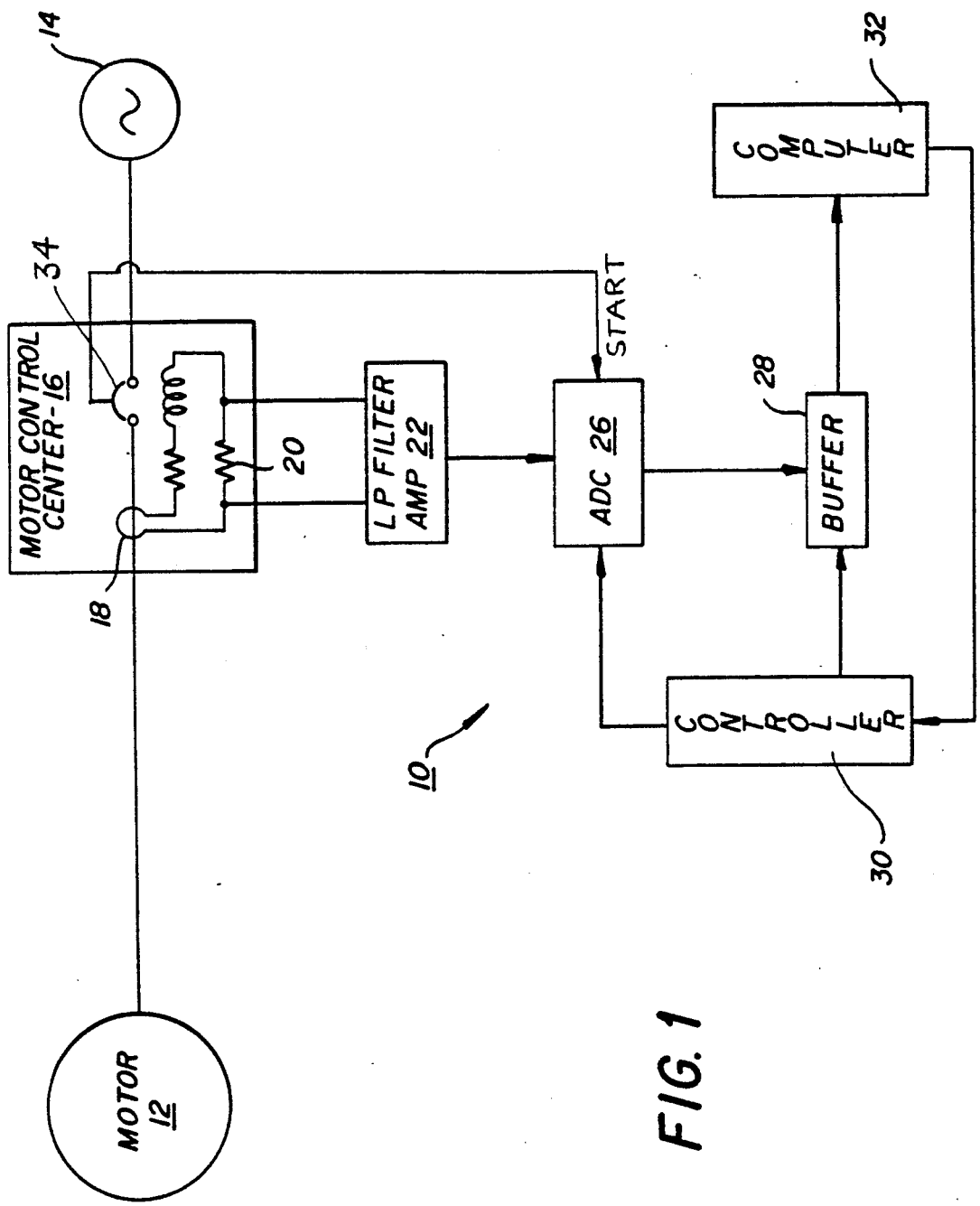
FIG. 1 is a circuit block diagram of rotor fault detection apparatus constructed in accordance with an embodiment of the present invention.

The detection apparatus of the present invention, generally indicated at 10 in FIG. 1, is illustrated in its application to detect rotor faults in an induction motor 12. The motor draws current from an AC source 14, for example a standard three-phase source of a standard line frequency, e.g. 60 Hz, through a typical motor control center 16. As is conventional, the motor control center is equipped with an instrument transformer 18 linked with one phase line to monitor the 60 Hz current for control and instrumentation purposes. Included in the instrument transformer secondary circuit is a small precision resistor 20 across which signals indicative of the one phase current drawn by the motor are tapped for application to detector 10. It will be appreciated that motor current may be monitored by a separate split core current transformer clipped on one phase line at any point in the feed circuit for motor 12.

Still referring to FIG. 1, the motor current signal tapped from resistor 20 is fed to a low pass filter/amplifier 22, such that signal content significantly above the line frequency is eliminated. The amplified and low-pass-filtered current signal is sampled and converted to a series of digital values by an analog-to-digital converter (ADC) 26, which are stored in a buffer 28. The signal sampling and digitizing rate, as well as the buffering of the digitized signal, are controlled and coordinated by a controller 30 under the programmed control of a computer 32 into which the digitized signal is loaded. This data collection procedure is carried out at a suitable sampling rate of, for example, 2000 samples per second over an appropriate period of about ten seconds to provide sufficient data covering the startup period of even large induction motors. Data collection is initiated in response to a start signal issued from the motor control center indicating closure of a contactor 34 to begin a startup period.

Figure 3A:
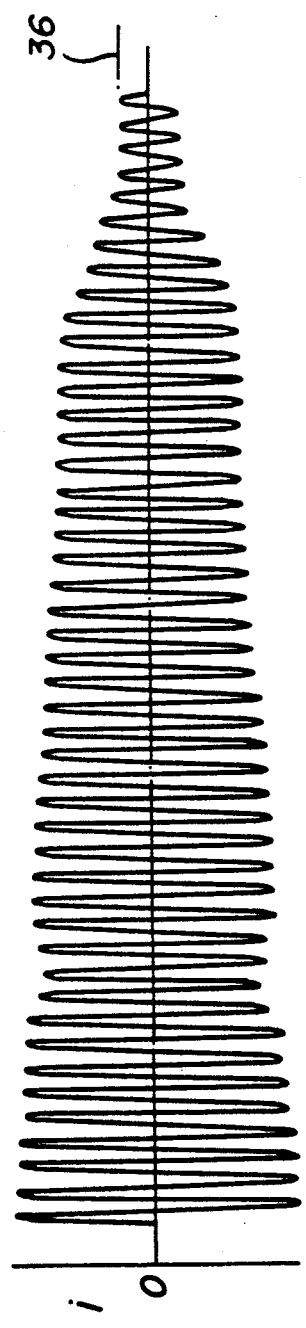
FIG. 3 is a series of graphs useful in the understanding of the present invention.
Figure 3B:
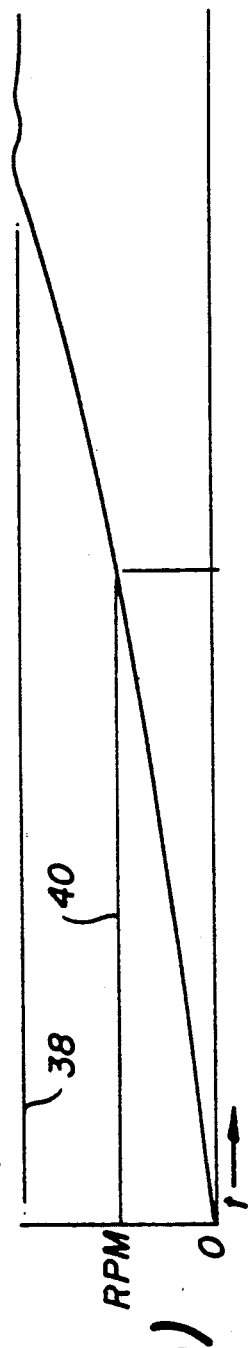
Figure 3C:
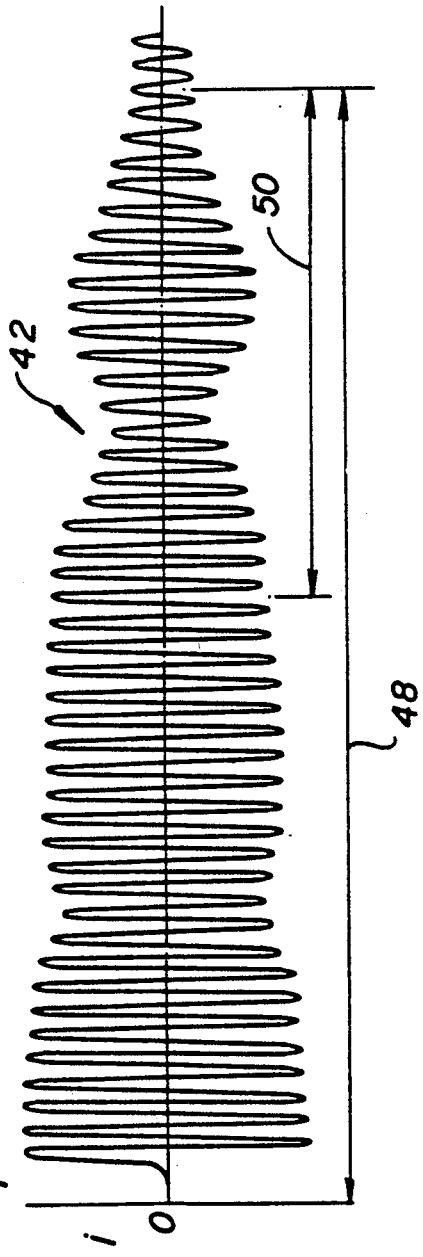

Graph (a) of FIG. 3 illustrates the typical startup motor current characteristics for an induction motor with a healthy rotor. It is seen that, momentarily after closure of contactor 34 (FIG. 1), the motor current i jumps to a maximum amplitude and generally, monotonically decreases to a steady state amplitude, indicated at 36, as the motor runs up to steady state or synchronous speed, indicated at 38 in graph (b). However, in the case of an induction motor having one or more broken rotor bars, the typical starting motor current has been found to possess the characteristics illustrated in graph (c). That is, upon contactor closure, the motor current again rises abruptly to a maximum amplitude and begins to monotonically decrease as the motor runs up toward synchronous speed. However, when the motor reaches approximately one-half synchronous speed indicated at 40 in graph (b) or slightly therebeyond, the motor current i exhibits a characteristic dip in amplitude, as indicated at 42 in graph (c). It is thus a principal objective of the present invention to provide method and apparatus for readily recognizing the presence and magnitude of this dip in the startup motor current, pursuant to detecting a faulted rotor.

Figure 2:
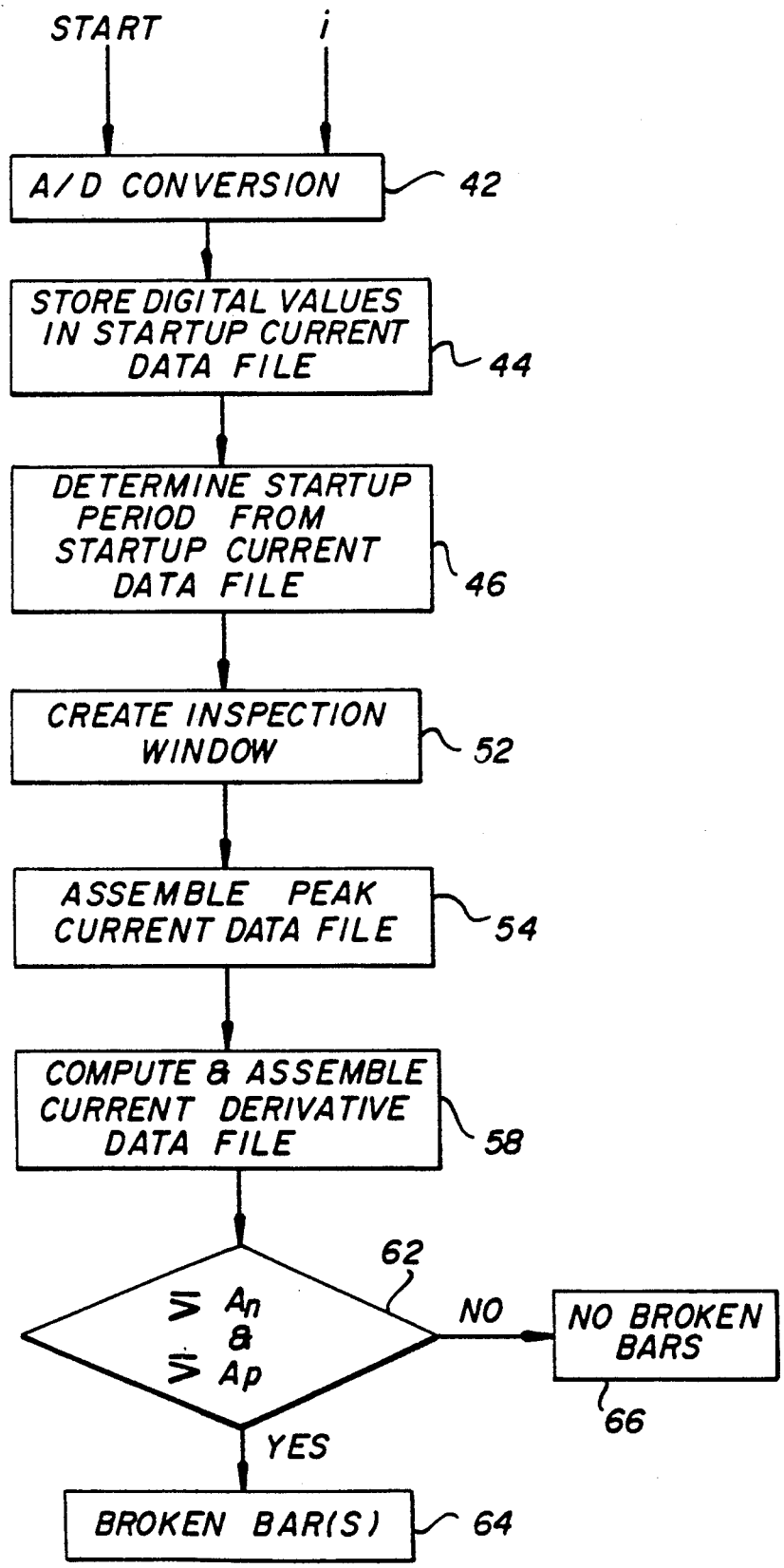
FIG. 2 is a flow chart illustrating the method in which the apparatus of FIG. 1 operates in accordance with the he present invention.

Referring jointly to FIG. 1 and the flow chart of FIG. 2, sampling and digital conversion of current signal i representing the monitored line current drawn by motor 12 during startup is initiated by the start signal as indicated by block 42. The analog values of the current samples are converted to digital values and stored as a file of digital signals as a function of startup time in computer 32, as indicated by block 44 in FIG. 2. The computer then examines this startup current data file to determine the duration of the startup period taken by the motor to run up to full speed, as indicated in block 46. The duration of this period, indicated at 48 in graph (c), varies depending on motor size and loading. The motor may be disconnected from a load, however, during startup, the inertia of the rotor does constitute a load which is being accelerated to full speed. Upon determining the startup period duration 48 from contactor closure start signal to steady state motor current amplitude, computer 32 then creates an inspection window, indicated at 50 in graph (c), covering the concluding portion of this startup period, for example the latter half thereof. This step is indicated by block 52. By looking for a rotor fault-indicating dip during the latter half of the startup period, dips in the motor current during the first half due to normal starting oscillations are ignored. Graph (d) illustrates on an expanded time scale the portion of the motor current within this inspection window containing rotor fault-indicating dip 42.

From the portion of the startup current data file within the inspection window, the computer assembles a peak current data file consisting of the absolute values of the positive and negative current peaks as a function of time, as indicated by block 54. Graph (e) of FIG. 3 is a curve 56 illustrating this peak current data file for the portion of the motor current illustrated in graph (d). Alternatively, the computer could assemble such a file from computed values of the area under each current half-cycle as a function of time. Next, as indicated by block 58, the computer is programmed to calculate the derivative or slope of curve 56 between each of the consecutive current peaks. This can be readily accomplished by subtracting from each current peak absolute value, graph (e), the absolute value of the immediately preceding current peak. From this computation, a derivative data file is assembled, which can be illustrated by curve 60 in graph (f). The computer then tests this derivative data file in decision block 62 to see if the derivative of the maximum negative slope, $-|i_p|dt$, of curve 56, as indicated by portion 60a of curve 60, equals or exceeds a predetermined threshold $A_n$ and if the derivative of the maximum positive slope of curve 56, $+d|i_p|/dt$, as indicated by curve portion 60b, equals or exceeds a predetermined positive threshold $A_p$. If both of these maximum negative and positive slope criteria are satisfied in that order, a broken rotor bar is indicated (block 64). As shown by block 66, if (1) neither criteria is satisfied, (2) either one, but not both are satisfied, or (3) both are satisfied, but in the wrong sequence, i.e., a positive slope $\geq A_p$ followed by a negative slope $\geq A_n$ indicating a blip rather than a dip, an indication is given that the rotor has no broken rotor bar(s).

It is thus seen that, by requiring satisfaction of both criteria in proper sequence, the normally high negative slope of the motor current envelope as the motor achieves synchronous speed near the conclusion of the startup period is readily distinguished from a rotor fault-indicating current dip. False broken rotor bar indications are thus avoided. It has been found that the extent by which the maximum values in the derivative data file exceed the threshold values $A_n$ and $A_p$ provides an indication of the severity of the broken rotor condition, i.e., number of broken rotor bars. Scheduling for repair can thus be predicated on the indicated severity.

Figure 4:
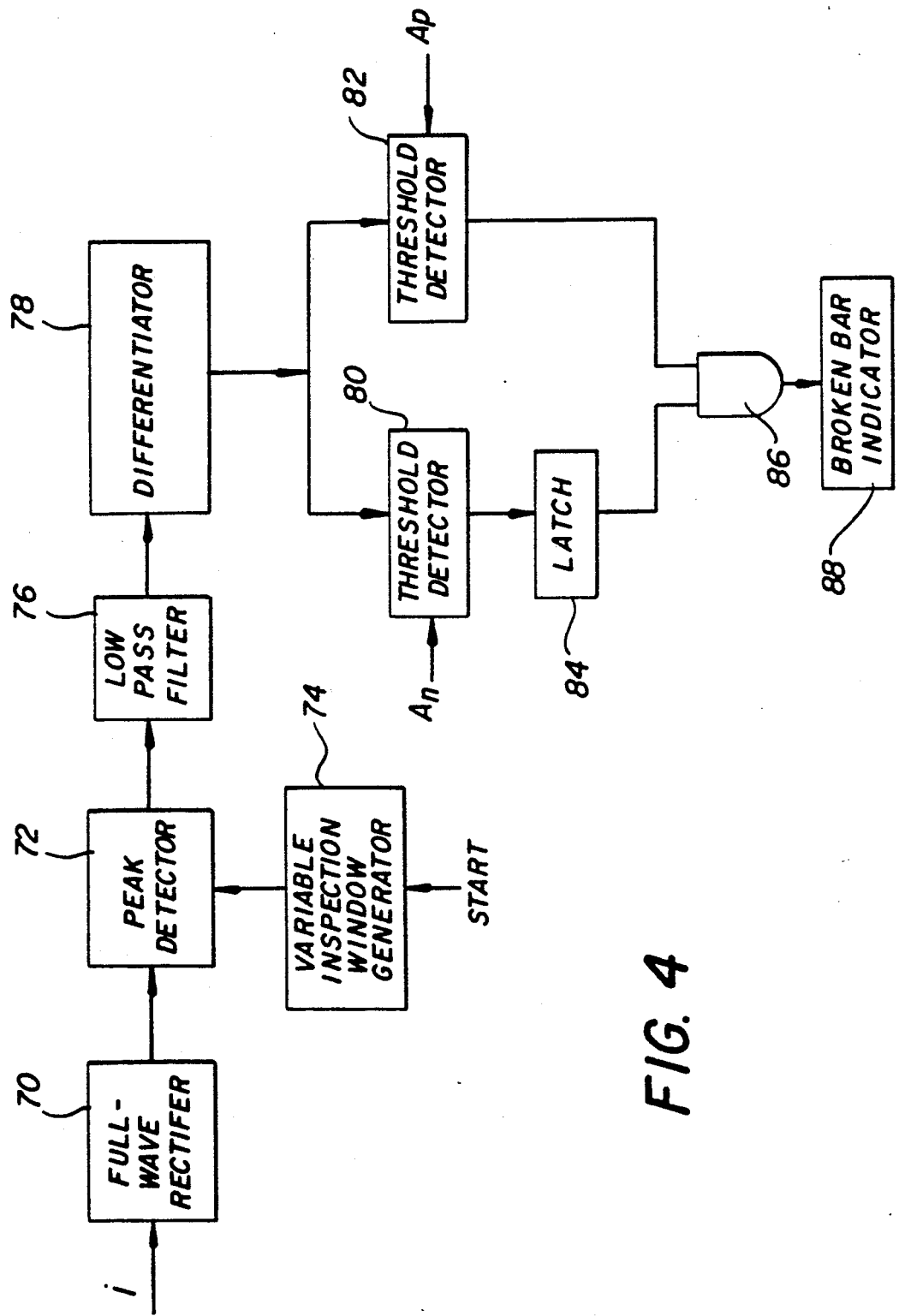
FIG. 4 is a circuit block diagram illustrating an alternative embodiment of the present invention.

From the block diagram seen in FIG. 4, it will be seen that rotor fault detection in accordance with the present invention can also be implemented using conventional analog signal hardware. To this end, the motor current signal i is rectified by a full-wave rectifier 70 and detected by a peak detector 72. The peak detector is gated on by a variable inspection window gate generator 74 triggered by the start signal from contactor 34 of FIG. 1. This gate generator creates an inspection window covering the latter half of the startup period during which the peak detector can respond to the full-wave rectified current signal. The width of the gate pulse is adjusted depending on the anticipated startup period duration predicted from the size of the motor and its loading.

The peak detected analog signal, which resembles curve 56 in FIG. 3, is filtered by a low pass filter 76 to remove signal content significantly above line frequency and then differentiated by a differentiator 78. The differentiator signal output, which resembles curve 60 of FIG. 3, is applied to a pair of threshold detectors 80 and 82. The former tests the differentiator signal output against negative slope threshold value $A_n$ and the latter tests the differentiator signal output against positive slope threshold value $A_p$. When the negative slope threshold is equaled or exceeded, threshold detector 80 sets a latch 84 which then enables one input of an AND gate 86. If the differentiator output signal subsequently equals or exceeds positive threshold value $A_p$, threshold detector 82 issues a signal which passes through gate 82 to activate a broken bar indicator 88. It is seen from the inclusion of latch 84 that, during the inspection window, the output of detector 80 must occur before the output of detector 82 to obtain a broken bar indication.

While the foregoing detailed description of the embodiment of the invention has made reference to an induction motor under test, it will be appreciated that these embodiments are equally applicable to detecting broken amortisseur bars in synchronous motors. Since amortisseur bars carry appreciable current only during the start up period, and broken amortisseur bars produce a similar characteristic dip in the motor current envelope as do induction motors with broken rotor bars, the present invention is uniquely suited to rotor fault detection of both induction and synchronous motors. Moreover, rotor fault detection pursuant to the present invention is extremely versatile in implementation since motor current is the only requisite input which can be derived at any convenient point between the motor and its power source. Intrusion into the motor operating environment is therefore unnecessary. Further, the motor is tested during its transient startup period, rather than under steady state operating conditions which, in certain situations, may be difficult or even impossible to achieve. Rotor fault detection under a transient condition renders the motor testable regardless of the characteristics of its connected load and whether or not it is even connected to a load.

While the present invention has been described with reference to specific embodiments, it is intended that matters of detail set forth above be taken as illustrative and not in a limiting sense and that the true scope of the invention be as defined in the appended claims.

Having described the invention, what is claimed as new and desired to secure by Letters Patent is:

1. A method for detecting broken rotor bars in induction and synchronous motors having a rotor including a plurality of conductive bars and a stator drawing current from an AC power supply, the method comprising the steps of:
    A. deriving an AC current signal indicative of said motor current during a transient startup period as the motor under test runs up from zero to steady state operating speed;
    B. processing said current signal to identify any dip in motor current amplitude by
        (1) developing a first signal representing the amplitudes of the half-cycle peaks of said current signal over at least a concluding portion of said startup period, and
        (2) developing a second signal which varies in magnitude as function of the difference in amplitudes of consecutive half-cycle peaks of said current signal, thereby to continuously indicate the slope of said first signal;
    C. testing each identified said motor current amplitude dip to determine the magnitude thereof by continuously comparing said second signal against negative and positive slope threshold values; and
    D. indicating a broken rotor bar condition when said negative and positive slope threshold values are exceeded.

2. The method defined in claim 1 wherein said indicating step provides a broken rotor bar indication only when the magnitude of said second signal varies such that said negative slope threshold value is exceeded prior in time during the concluding portion of said startup period than said positive slope threshold value is exceeded.

3. The method defined in claim 2, wherein said current signal processing step further includes the steps of:
    (1) full-wave rectifying said current signal,
    (2) peak detecting said full-wave rectified current signal to develop said first signal, and
    (3) differentiating said first signal to develop said second signal.

4. The method defined in claim 3, wherein said current signal processing step further includes the step of limiting the development of said first signal in said peak detecting step to substantially the concluding half-portion of said startup period.

5. Apparatus for detecting broken rotor bars in induction and synchronous motors having a rotor including a plurality of conductive bars and a stator drawing motor current from an AC power source, said apparatus comprising, in combination:
   A. a current sensor for deriving a current signal indicative of said motor current;
   B. first means for generating a start signal indicating the initiation of a startup period during which the motor under test draws starting motor current as it runs up from zero to steady state operating speed;
   C. second means triggered by said start signal to begin processing said current signal to
      (1) develop a first signal representing the amplitudes of the half-cycle peaks of said current signal over at least a concluding portion of said startup period, and
      (2) develop a second signal which varies in magnitude as a function of the difference in amplitudes of consecutive half-cycle peaks of said current signal, thereby to continuously indicate the slope of said first signal, such as to identify any dip in amplitude of said starting motor current;
   D. third means for testing each identified said starting motor current amplitude dip to determine the magnitude thereof, said third means including detector means for comparing said second signal against relatively negative and positive slope threshold values; and
   E. fourth means for indicating a broken rotor bar condition when when said positive and negative threshold values are exceeded.

6. The apparatus defined in claim 5, wherein said detector means signals said fourth means to indicate a broken rotor bar condition only when the magnitude of said second signal varies such that during said startup period, said negative slope threshold value is exceeded before said positive slope threshold value is exceeded.

7. The apparatus defined in claim 6, wherein said second means includes:
   (1) a rectifier for full-wave rectifying said AC current signal,
   (2) a peak detector for developing said first signal from said full-wave rectified AC current signal, and
   (3) a differentiator for differentiating said first signal to develop said second signal.

8. The apparatus defined in claim 7, wherein said second means further includes an inspection window generator responsive to said start signal for generating a gate pulse to limit the development of said first signal by said peak detector to an interval including substantially the concluding half-portion of said startup period.

9. A method for detecting broken rotor bars in induction and synchronous motors having a rotor including a plurality of conductive bars and a stator drawing current from an AC power supply, the method comprising the steps of:
   A. deriving an AC current signal indicative of said motor current during a transient startup period as the motor under test runs up from zero to steady state operating speed;
   B. processing said current signal to identify any dip in motor current amplitude by
      (1) sampling said current signal at a predetermined sampling rate to obtain a time succession of analog current values over said startup period,
      (2) converting said analog current values to digital current values,
      (3) storing said digital current values in a current signal data file,
      (4) assembling from said current signal data file a current peak data file of the peak amplitude values of said AC current signal, and
      (5) assembling a current derivative data file consisting of derivative values representing the differences in consecutive peak amplitude values contained in said current peak data file;
   C. testing each identified said motor current amplitude dip to determine the magnitude thereof by scanning said current derivative data file for derivative values exceeding relatively positive and negative threshold values; and
   D. indicating a broken rotor bar condition only when, during said startup period, at least one of said derivative values in said derivative data file exceeds said negative threshold value before at least another one of said derivative values exceeds said positive threshold value.

10. The method defined in claim 9, wherein said current signal processing step further includes the steps of:
   (1) determining from said current signal data file the duration of said startup period, and
   (2) limiting at least said current derivative data file to derivative values applicable to substantially the concluding half-portion of said startup period.

11. Apparatus for detecting broken rotor bars in induction and synchronous motors having a rotor including a plurality of conductive bars and a stator drawing motor current from an AC power source, said apparatus comprising, in combination:
   A. a current sensor for deriving a current signal indicative of said motor current;
   B. first means for generating a start signal indicating the initiation of a startup period during which the motor under test draws starting motor current as it run up from zero to steady state operating speed;
   C. second means triggered by said start signal to begin processing said current signal such as to identify any dip in amplitude of said starting motor current; said second means includes
      (1) a converter for sampling said current signal at a predetermined sampling rate to obtain a time succession of analog current values over said startup period and converting said analog current values to digital current values, and
      (2) a digital computer for storing said digital current values in a current signal data file, said computer including first assembly means for assembling from said current signal data file a current peak data file of the peak amplitude values of the AC current signal, and second assembly means for assembling a current derivative data file consisting of derivative values representing the differences in consecutive said peak amplitude values contained in said current peak data file;
   D. third means included in said computer for scanning said current derivative data file for derivative values exceeding positive and negative threshold values; and
   E. fourth means for indicating a broken rotor bar condition only when at least one of said derivative values in said derivative date file exceeds said negative threshold value before at least another one of said derivative values exceeds said positive threshold value during said startup period.

12. The apparatus defined in claim 11, wherein said second means further includes defining means for defining from said current signal data file the duration of said startup period, and generator means responsive to said defining means for generating an inspection window covering substantially the concluding half-portion of said startup period over which said derivative values of said current derivative data file are assembled by second assembly means.

* * * * *